(12) United States Patent
Charlot et al.

(10) Patent No.: US 11,994,571 B2
(45) Date of Patent: May 28, 2024

(54) 5-PS-RESOLUTION WAVEFORM-CAPTURE-DEVICE ON A FIELD-PROGRAMMABLE GATE-ARRAY WITH DYNAMIC PHASE-SHIFTING

(71) Applicants: OHIO STATE INNOVATION FOUNDATION, Columbus, OH (US); Potomac Research LLC, Alexandria, VA (US)

(72) Inventors: Noeloikeau Charlot, Columbus, OH (US); Daniel Gauthier, Columbus, OH (US); Andrew Pomerance, Alexandria, VA (US)

(73) Assignees: Ohio State Innovation Foundation, Columbus, OH (US); Potomac Research LLC, Alexandria, VA (US)

(*) Notice: Subject to any disclaimer, the term of this patent is extended or adjusted under 35 U.S.C. 154(b) by 214 days.

(21) Appl. No.: 17/676,340

(22) Filed: Feb. 21, 2022

(65) Prior Publication Data
US 2022/0342023 A1 Oct. 27, 2022

Related U.S. Application Data

(60) Provisional application No. 63/177,435, filed on Apr. 21, 2021.

(51) Int. Cl.
*G01R 35/00* (2006.01)
*G01R 13/02* (2006.01)
(Continued)

(52) U.S. Cl.
CPC ........ *G01R 35/005* (2013.01); *G01R 13/02* (2013.01); *G04F 10/005* (2013.01); *H03K 19/173* (2013.01)

(58) Field of Classification Search
CPC ...... G01R 35/00; G01R 35/005; G01R 13/00; G01R 13/02; G01R 13/0218; G04F 10/00;
(Continued)

(56) References Cited

U.S. PATENT DOCUMENTS

| | | | | |
|---|---|---|---|---|
| 6,137,749 A | * | 10/2000 | Sumner | G04F 10/04 368/118 |
| 6,288,587 B1 | * | 9/2001 | Chen | H03K 5/159 327/261 |

(Continued)

FOREIGN PATENT DOCUMENTS

CN 107300632 A * 10/2017 ......... G01R 13/0218

OTHER PUBLICATIONS

X. Qin, W.-Z. Zhang, L. Wang, Y. Tong, H. Yang, Y. Rui, X. Rong, and J.-F. Du, "A pico-second resolution arbitrary timing generator based on time folding and time interpolating," Review of Scientific Instruments, vol. 89, No. 7, p. 074701, Jul. 2018. [Online]. Available: http://aip.scitation.org/doi/10.1063/1.5037841.

(Continued)

*Primary Examiner* — Hoai-An D. Nguyen
(74) *Attorney, Agent, or Firm* — Meunier Carlin & Curfman LLC (57) ABSTRACT

A waveform capture device (WCD) is a flexible measurement system capable of recording complex digital signals on trillionth-of-a-second (ps) time scales. The WCD may be implemented via modular code on an off-the-shelf field-programmable gate-array (FPGA), and incorporates both time-to-digital converter (TDC) and digital storage oscilloscope (DSO) functionality. The device captures a waveform by taking snapshots of a signal as it propagates down an ultra-fast transmission line known as a carry chain (CC). It may be calibrated via a dynamic phase-shifting (DPS)

(Continued)

method that requires substantially less data and resources than conventional techniques.

15 Claims, 6 Drawing Sheets

(51) Int. Cl.
*G04F 10/00* (2006.01)
*H03K 19/173* (2006.01)

(58) Field of Classification Search
CPC ...... G04F 10/005; H03K 19/00; H03K 19/02; H03K 19/173
USPC .......................................... 324/600, 601, 74
See application file for complete search history.

(56) References Cited

U.S. PATENT DOCUMENTS

| | | | |
|---|---|---|---|
| 10,003,453 B1* | 6/2018 | Bradley | ................. H04L 1/248 |
| 2012/0062296 A1* | 3/2012 | Miyashita | ............. G04F 10/005 327/159 |
| 2021/0216095 A1* | 7/2021 | Szymanski | ............... G06F 1/12 |

OTHER PUBLICATIONS

W. Gao, D. Gao, C. Hu-Guo, and Y. Hu, "Integrated High-Resolution Multi-Channel Time-to-Digital Converters (TDCs) for PET Imaging," in Biomedical Engineering, Trends in Electronics, Communications and Software, A. Laskovski, Ed. InTech, Jan. 2011. [Online]. Available: http://www.intechopen.com/books/biomedical-engineering-trends-in-electronics-communications-and-software/integrated-high-resolution-multi-channel-time-to-digital-converters-tdcs-for-pet-imaging.
S. Tancock, E. Arabul, and N. Dahnoun, "A Review of New Time-to-Digital Conversion Techniques," IEEE Transactions on Instrumentation and Measurement, vol. 68, No. 10, pp. 3406-3417, Oct. 2019. [Online]. Available: https://ieeexplore.ieee.org/document/8809777/.
S. K. Pal, A. Kumar, and K. Kumawat, "Design and VLSI Implementation of a Digital Oscilloscope," in 2012 Fourth International Conference on Computational Intelligence and Communication Networks. Mathura, Uttar Pradesh, India: IEEE, Nov. 2012, pp. 473-476. [Online]. Available: http://ieeexplore.ieee.org/document/6375158/.
T. Sui, "A 2.3-ps RMS Resolution Time-to-Digital Converter Implemented in a Low-Cost Cyclone V FPGA," IEEE Transactions on Instrumentation and Measurement, vol. 68, No. 10, p. 14, 2019.
Y. Wang and C. Liu, "A 4.2 ps Time-Interval RMS Resolution Timeto-Digital Converter Using a Bin Decimation Method in an UltraScale FPGA," IEEE Transactions on Nuclear Science, vol. 63, No. 5, pp. 2632-2638, Oct. 2016. [Online]. Available: http://ieeexplore.ieee.org/document/7562355/.
X. Qin, M.-D. Zhu, W.-Z. Zhang, Y.-H. Lin, Y. Rui, X. Rong, and J. Du, "A high resolution time-to-digital-convertor based on a carry-chain and DSP48E1 adders in a 28-nm field-programmable-gate-array," Review of Scientific Instruments, vol. 91, No. 2, p. 024708, Feb. 2020. [Online]. Available: http://aip.scitation.org/doi/10.1063/1.5141391.
J. Wu, "Several Key Issues on Implementing Delay Line Based TDCs Using FPGAs," IEEE Transactions on Nuclear Science, vol. 57, No. 3, pp. 1543-1548, Jun. 2010. [Online]. Available: http://ieeexplore.ieee.org/document/5485143/.
JinyuanWu, Sten Hansen, and Zonghan Shi, "ADC and TDC implemented using FPGA," in 2007 IEEE Nuclear Science Symposium Conference Record. Honolulu, HI, USA: IEEE, Oct. 2007, pp. 281-286, ISSN: 1082-3654. [Online]. Available: http://ieeexplore.ieee.org/document/4436331/.
R. J. Costa, D. E. Pinho, and G. R. Alves, "Using embedded instruments to design weblabs: An FPGA-embedded oscilloscope based on the IEEE1451.0 Std." in 2015 3rd Experiment International Conference (exp.at'15). Ponta Delgada, Portugal: IEEE, Jun. 2015, pp. 41-46. [Online]. Available: http://ieeexplore.ieee.org/document/7463211/.
Jinyuan Wu, "An FPGA wave union TDC for time-of-flight applications," in 2009 IEEE Nuclear Science Symposium Conference Record (NSS/MIC). Orlando, FL: IEEE, Oct. 2009, pp. 299-304. [Online]. Available: http://ieeexplore.ieee.org/document/5401738/.
N. Dutton, J. Vergote, S. Gnecchi, L. Grant, D. Lee, S. Pellegrini, B. Rae, and R. Henderson, "Multiple-event direct to histogram TDC in 65nm FPGA technology," in 2014 10th Conference on Ph.D. Research in Microelectronics and Electronics (PRIME). Grenoble: IEEE, Jun. 2014, pp. 1-5. [Online]. Available: http://ieeexplore.ieee.org/document/6872727/.
Q. Zhong, M. Xiangting, L. Deyuan, Y. Lei, Y. Zeen, and L. Dongcang, "Submitted to 'Chinese Physics C'," p. 8. 2015.
K. Katoh and K. Namba, "A low area calibration technique of TDC using variable clock generator for accurate on-line delay measurement," in Sixteenth International Symposium on Quality Electronic Design. Santa Clara, CA, USA: IEEE, Mar. 2015, pp. 430-434. [Online]. Available: http://ieeexplore.ieee.org/document/7085464.
K. Katoh and K. Namba, "Time-to-Digital Converter-Based Maximum Delay Sensor for On-Line Timing Error Detection in Logic Block of Very Large Scale Integration Circuits," Sensors and Materials, vol. 27, No. 10 (2015) 933-943. [Online]. Available: http://myukk.org/SM2017/article.php?ss=1158.
R. Cui and K. Namba, "A Calibration Technique for DVMC with Delay Time Controllable Inverter," IPSJ Transactions on System LSI Design Methodology, vol. 9, No. 0, pp. 30-36, 2016. [Online]. Available: https://www.jstage.jst.go.jp/article/ipsjtsldm/9/0/9_30/_article.
K. Cui, X. Li, and R. Zhu, "A high-linearity time-to-digital converter based on dynamically delay-adjustable looped carry chains on FPGAs," Review of Scientific Instruments, vol. 89, No. 8, p. 084704, Aug. 2018. [Online]. Available: http://aip.scitation.org/doi/10.1063/1.5038146.
M.-A. Daigneault and J. P. David, "A High-Resolution Time-to-Digital Converter on FPGA Using Dynamic Reconfiguration," IEEE Transactions on Instrumentation and Measurement, vol. 60, No. 6, p. 10, 2011.
J. Kuang and Y. Wang, "A 5.5 ps Time-interval RMS Precision Time-to-Digital Convertor Implemented in Intel Arria 10 FPGA," p. 3.
P. Ghoshal and S. K. Sen, "A bit swap logic (BSL) based bubble error correction (BEC) method for flash ADCs," in 2016 2nd International Conference on Control, Instrumentation, Energy & Communication (CIEC). Kolkata, India: IEEE, Jan. 2016, pp. 111-115. [Online]. Available: http://ieeexplore.ieee.org/document/7513760/.
Z. Zhao, Q. Huang, Z. Gong, Z. Su, W. W. Moses, J. Xu, and Q. Peng, "A Novel Read-Out Electronics Design Based on 1-Bit Sigma-Delta Modulation," IEEE Transactions on Nuclear Science, vol. 64, No. 2, pp. 820-828, Feb. 2017. [Online]. Available: http://ieeexplore.ieee.org/document/7807257/.
M. Ruiz-Gonzalez and L. R. Furenlid, "Design of a 2-Bit Sigma-Delta Modulator for Scintillation Waveform Capture," in 2017 IEEE Nuclear Science Symposium and Medical Imaging Conference (NSS/MIC). Atlanta, GA: IEEE, Oct. 2017, pp. 1-2. [Online]. Available: https://ieeexplore.ieee.org/document/8532727/.
U. Hazarika, M. Das, and K. K. Sarma, "A Reconfigurable Time Multiplexed Multichannel ADC Model for Efficient Data Acquisition," in 2020 International Conference on Computational Performance Evaluation (ComPE). Shillong, India: IEEE, Jul. 2020, pp. 809-812. [Online]. Available: https://ieeexplore.ieee.org/document/9200007.
C. Ma, X. Dong, L. Yu, W. Wang, X. Zhao, X. Li, Z. Huang, G. Wu, L. Lu, and H. Chen, "Design and evaluation of an FPGA-ADC prototype for the PET detector based on LYSO Crystals and SiPM arrays," IEEE Transactions on Radiation and Plasma Medical Sciences, pp. 1-1, 2021. [Online]. Available: https://ieeexplore.ieee.org/document/9364276/.

(56) References Cited

OTHER PUBLICATIONS

"AN 661: Implementing Fractional PLL Reconfiguration with Altera PLL and Altera PLL Reconfig IP Cores," p. 27. (2019), p. 27.

J. Tatsukawa, "MMCM and PLL Dynamic Reconfiguration," p. 20, 2019.

M. H. Perrott, "Tutorial on Digital Phase-Locked Loops," p. 118.

"Cyclone V Device Datasheet," 2019. p. 94.

M. Ghil and A. Mullhaupt, "Boolean delay equations. ii. periodic and aperiodic solutions," Journal of Statistical Physics, vol. 41, No. 1-2, pp. 125-173, Oct. 1985. [Online]. Available: http://link.springer.com/10.1007/BF01020607.

J. Lohmann, O. D'Huys, N. D. Haynes, E. Schöll, and D. J. Gauthier, "Transient dynamics and their control in time-delay autonomous boolean ring networks," Phys. Rev. E, vol. 95, p. 022211, Feb. 2017. [Online]. Available: https://link.aps.org/doi/10.1103/PhysRevE.95.022211.

N. Charlot, D. Canaday, A. Pomerance, and D. J. Gauthier, "Hybrid boolean networks as physically unclonable functions," IEEE Access, vol. 9, p. 44 855-44 867, 2021.

D. P. Rosin, Autonomous Boolean Networks on Electronic Chips, ser. Springer Theses. Springer International Publishing, 2015, ch. chapter 4, p. 37. [Online]. Available: http://link.springer.com/10.1007/978-3-319-13578-6_3.

H. Chen, Y. Zhang, and D. D.-U. Li, "A Low Nonlinearity, Missing-Code Free Time-to-Digital Converter Based on 28-nm FPGAs With Embedded Bin-Width Calibrations," IEEE Transactions on Instrumentation and Measurement, vol. 66, No. 7, pp. 1912-1921, Jul. 2017. [Online]. Available: https://ieeexplore.ieee.org/document/7898491/.

Hongdi Li, Chao Wang, Shaohui An, Xingyu Lu, Yun Dong, Shitao Liu, H. Baghaei, Yuxuan Zhang, R. Ramirez, and Wai-Hoi Wong, "An Accurate Timing Alignment Method With Time-to-Digital Converter Linearity Calibration for High-Resolution TOF PET," IEEE Transactions on Nuclear Science, vol. 62, No. 3, pp. 799-804, Jun. 2015. [Online]. Available: http://ieeexplore.ieee.org/document/7117473.

Y.-H. Chen, "Time Resolution Improvement Using Dual Delay Lines for Field-Programmable-Gate-Array-Based Time-to-Digital Converters with Real-Time Calibration," Applied Sciences, vol. 9, No. 1, p. 20, Dec. 2018. [Online]. Available: http://www.mdpi.com/2076-3417/9/1/20.

J. Y. Won and J. S. Lee, "Time-to-Digital Converter Using a Tuned-Delay Line Evaluated in 28-, 40-, and 45-nm FPGAs," IEEE Transactions on Instrumentation and Measurement, vol. 65, No. 7, pp. 1678-1689, Jul. 2016. [Online]. Available: http://ieeexplore.ieee.org/document/7448918/.

"LCELL WYSIWYG Description for the Cyclone II Architecture," p. 13, 2005.

* cited by examiner

5-PS-RESOLUTION WAVEFORM-CAPTURE-DEVICE ON A FIELD-PROGRAMMABLE GATE-ARRAY WITH DYNAMIC PHASE-SHIFTING

CROSS-REFERENCE TO RELATED APPLICATIONS

This application claims the benefit of U.S. provisional patent application No. 63/177,435, filed on Apr. 21, 2021, and entitled "5-PS-RESOLUTION WAVEFORM-CAPTURE-DEVICE ON A FIELD-PROGRAMMABLE GATE-ARRAY WITH DYNAMIC PHASE-SHIFTING," the disclosure of which is expressly incorporated herein by reference in its entirety.

STATEMENT OF GOVERNMENT SUPPORT

This invention was made with government support under grant/contract no. W31P4Q-20-C-0003 awarded by the Department of the Army. The government has certain rights in the invention.

BACKGROUND

Measuring time-dependent digital waveforms with accuracy and precision is crucial in many fields of science and engineering, with applications ranging from wireless communication systems and GPS to medical imaging and PET scans. Depending on the use-case, two technologies are routinely employed: time-to-digital converters (TDCs), and digital storage oscilloscopes (DSOs). DSOs measure the history of a signal as it varies over time (its waveform), akin to a video. TDCs measure the time interval between digital events, akin to a stopwatch. Historically, the two technologies have been composed of different application-specific integrated-circuits (ASICs).

Recently however, field-programmable gate arrays (FPGAs) have become an attractive alternative to ASICs for many applications. FPGAs can act as a "one-size fits all" solution due to their ability to implement nearly any circuit by reconfiguring their hardware using only code and software. For this reason, industrially-competitive FPGA based TDCs have become an area of intense research in fields where precision timing is critical, offering picosecond (ps) resolution without the need for specialized hardware. However, FPGA-TDCs have drawbacks such as difficulties in generating reliable ps time-intervals for device calibration, and signal distortions due to uncontrollable delays and variations in the logic elements. DSOs encounter additional difficulties with the FPGA platform and are often considered inferior to commercial products.

It is with respect to these and other considerations that the various aspects and embodiments of the present disclosure are presented.

SUMMARY

A Waveform-Capture-Device (WCD) is described, an implementation of which is a 5 picosecond (ps)-resolution time-to-digital converter (TDC)/ultra-fast digital oscilloscope (DO) hybrid. The WCD is capable of measuring complex GHz frequency waveforms at picosecond (ps) time intervals.

In some implementations, a device comprises a time-to-digital converter (TDC) and a digital oscilloscope (DO).

Implementations may include some or all of the following features. The device is a waveform-capture-device (WCD). The WCD is a 5 ps-resolution TDC/ultra-fast DO hybrid. The WCD is implemented on a field-programmable gate-array (FPGA). The WCD is configured to measure complex GHz frequency waveforms at picosecond time intervals. The WCD is calibrated via a dynamic phase-shifting (DPS) method. The WCD uses a plurality of carry-chains (CCs) to capture a digital waveform without encoding the digital waveform. The device further comprises a tapped delay line (TDL) comprising a plurality of registers and the plurality of CCs. Each CC is used to buffer an input signal and wherein the registers are used to capture a waveform of the input signal on an edge of a clock. Each CC comprises at least one carry-element (CD) that passes the input signal to another CE after a time-delay.

In some implementations, a method of calibrating a waveform-capture-device (WCD) comprises using dynamic phase shifting (DPS) for discrete measurement.

Implementations may include some or all of the following features. The DPS uses dynamic-phase calibration (DPC). The DPS functions by adjusting the phase of a stable on-board clock, wherein the clock is a phase-lock loop (PLL). The DPS generates ps-scale time-intervals without reconfiguring a field-programmable gate-array (FPGA). The WCD is a digital buffer and the DPC is a is a velocity calculation that measures the distance travelled down the digital buffer after a phase-shift. For the discrete measurement, a capture time is incrementally delayed in discrete intervals via the DPS, and an input signal is repeatedly generated and measured once after every accumulated phase shift, thereby allowing for calibration of a carry speed.

In some implementations, a waveform-capture-device (WCD) comprises a time-to-digital converter (TDC) and a digital oscilloscope (DO).

Implementations may include some or all of the following features. The device further comprises a tapped delay line (TDL) comprising a plurality of registers and a plurality of carry-chains (CCs), wherein the CCs are configured to capture a digital waveform without encoding the digital waveform, wherein each CC is used to buffer an input signal and wherein the registers are used to capture a waveform of the input signal on an edge of a clock, and wherein each CC comprises at least one carry-element (CD) that passes the input signal to another CE after a time-delay. The WCD is implemented on a field-programmable gate-array (FPGA), wherein the WCD is configured to measure complex GHz frequency waveforms at picosecond time intervals, and wherein the WCD is calibrated via a dynamic phase-shifting (DPS) method. The DPS uses dynamic-phase calibration (DPC) and wherein the DPS functions by adjusting the phase of a stable on-board clock, wherein the clock is a phase-lock loop (PLL).

This summary is provided to introduce a selection of concepts in a simplified form that are further described below in the detailed description. This summary is not intended to identify key features or essential features of the claimed subject matter, nor is it intended to be used to limit the scope of the claimed subject matter.

BRIEF DESCRIPTION OF THE DRAWINGS

The foregoing summary, as well as the following detailed description of illustrative embodiments, is better understood when read in conjunction with the appended drawings. For the purpose of illustrating the embodiments, there is shown in the drawings example constructions of the embodiments.

however, the embodiments are not limited to the specific methods and instrumentalities disclosed. In the drawings.

DETAILED DESCRIPTION

This description provides examples not intended to limit the scope of the appended claims. The figures generally indicate the features of the examples, where it is understood and appreciated that like reference numerals are used to refer to like elements. Reference in the specification to "one embodiment" or "an embodiment" or "an example embodiment" means that a particular feature, structure, or characteristic described is included in at least one embodiment described herein and does not imply that the feature, structure, or characteristic is present in all embodiments described herein.

A waveform capture device (WCD) is described herein, and is a flexible measurement system capable of recording complex digital signals on trillionth-of-a-second (ps) time scales. In some implementations, the WCD may be implemented via modular code on an off-the-shelf field-programmable gate-array (FPGA), and incorporates both time-to-digital converter (TDC) and digital storage oscilloscope (DSO) functionality. The device captures a waveform by taking snapshots of a signal as it propagates down an ultra-fast transmission line known as a carry chain (CC). It may be calibrated via a dynamic phase-shifting (DPS) method that requires substantially less data and resources than conventional techniques. More particularly, the WCD is calibrated via a DPS method that uses significantly less resources than conventional TDC calibration mechanisms and uses as little as a single read operation. The calibration method described herein is also compatible with existing TDCs. A DPS-calibrated WCD is provided to capture dynamical phenomena with unprecedented precision, reproduce known results, and present several new measurements of interest.

An implementation of a WCD is a 5 ps-resolution TDC/ ultra-fast digital oscilloscope (DO) hybrid, implemented on a Cyclone V FPGA. Other FPGAs with on-chip dynamic phase shifting phase-locked loop devices can also be used. The WCD is capable of measuring complex GHz frequency waveforms at picosecond time intervals.

The WCD uses long CCs to capture a digital waveform without encoding it. As a result, the dynamics of arbitrary digital signals, not just timestamp pulse edges, can be measured with little overhead.

Calibration of the device uses a technique referred to as dynamic-phase calibration (DPC). DPC relies on DPS, which functions by adjusting the phase of a stable on-board clock known as a phase-lock loop (PLL). DPS reliably generates precise ps-scale time-intervals without re-configuring the FPGA. As a result, many of the conventional difficulties and complications associated with TDC calibration are eliminated.

In short, the WCD is a digital buffer that continuously measures the history of an input signal, and DPC is a velocity calculation that measures the distance travelled down this buffer after a phase-shift.

Figure 1A:
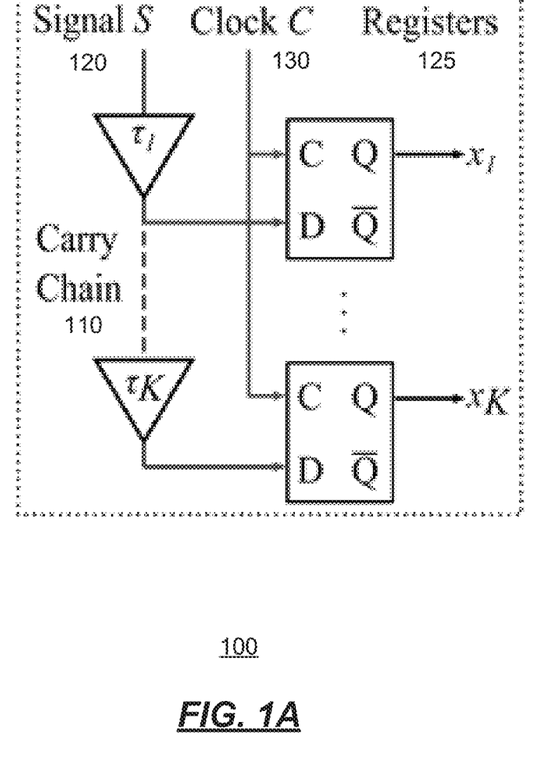
FIG. 1A is a schematic diagram of a tapped delay line (TDL) comprising multiple registers.
Figure 1B:
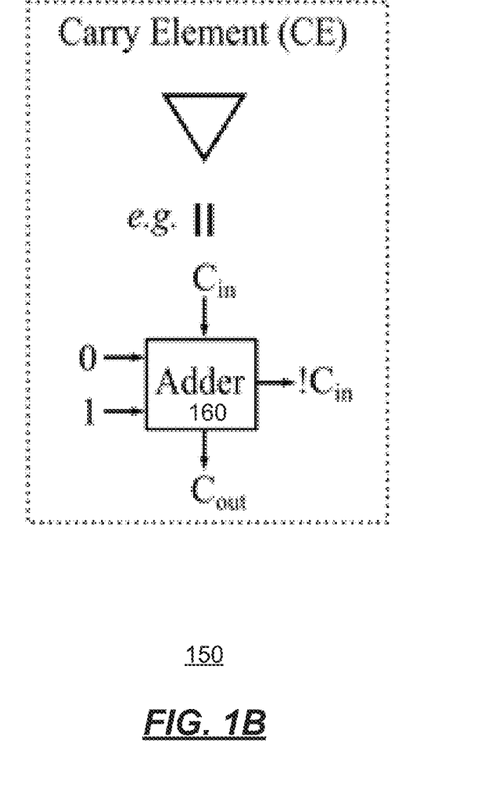
FIG. 1B is a schematic diagram of a carry elements (CEs)

FIGS. 1A and 1B show primary building blocks of an implementation of a WCD. More particularly, FIG. 1A is a schematic diagram of a tapped delay line (TDL) 100 comprising multiple registers. FIG. 1B is a schematic diagram of a carry elements (CEs) 150.

The TDL 100 is composed of a CC 110 used to buffer an input signal S 120 and registers 125 used to capture its waveform on the edge of a clock. The CC is composed of a chain of K carry-elements (CEs) 150 that pass the signal 120 to the next CE 150 after some time-delay Tk. Each CE 150 is composed of a redundant logic element such as an adder 160 with fixed inputs whose sole purpose is to route the input signal down the special high-speed transmission lines that FPGAs reserve for carry operations. As in FIG. 1B, the signal also passes from each carry to a corresponding register. Each register 125 stores the signal at that point in the chain as a bit $x_k$ when a global clock C 130 goes high, effectively capturing the waveform.

The concatenation of the register outputs forms a K-bit digital word $X=\{x_1, \ldots, x_K\} \in \{0, 1\}^K$ directly encoding the captured waveform. Suppose each of the K carries acts as a nominal time-delay τ. It takes K×τ time for S to travel down the CC. Further suppose that the clock C triggers all registers in the TDL simultaneously at time t. The TDL 100 captures signal S backward in time from t in K increments of time z. Hence, the principle of waveform capture is $$X(t)=\theta(\{S(t-\tau), \ldots, S(t-K\times\tau)\}) \quad (1)$$

where $\theta:[S_{min}, S_{max}]^K \to \{0,1\}^K$ is an element-wise Booleanization operation representing the digitization of the signal performed by the registers.

Figure 2:
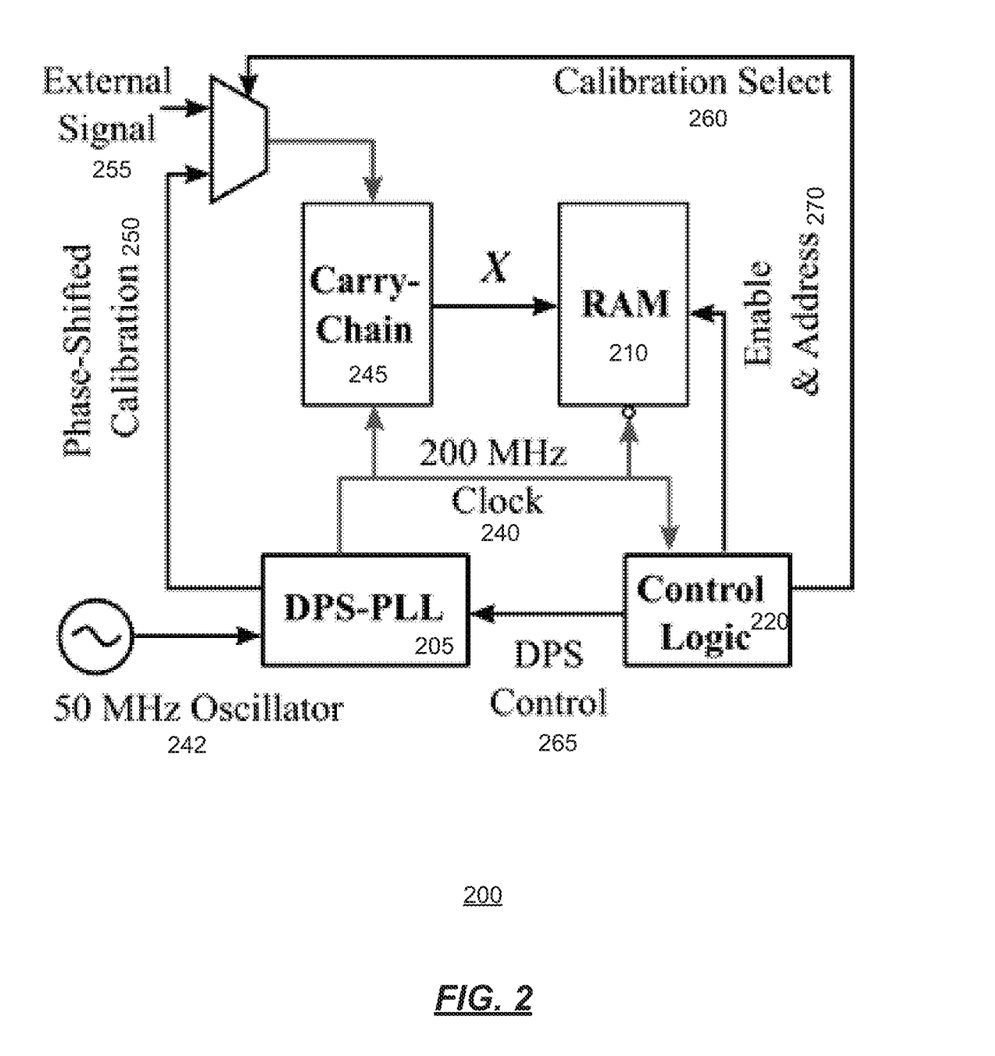
FIG. 2 is a diagram of an implementation of a WCD.

FIG. 2 is a diagram of an implementation of a WCD 200. FIG. 2 shows a WCD and DPS-calibration block diagram. The DPS-PLL (dynamic phase-shifting phase-lock loop) 205, RAM 210, and TDL (e.g., comprising the clock 240 and carry-chain 245) are governed by control logic 220, and the entire WCD 200 is clocked continuously by a 200 MHz PLL 240 output C.

When not in calibration mode, the signal to capture the last K×τ=(1300)(≈5 ps)=6.5 ns of the waveform of S is sent to the TDL every T=5 ns on the positive edge of C. This provides redundancy and ensures no portion of the waveform is lost. The data is then pushed to RAM 210 as a K=1300 bit digital word on the negative edge of C, chosen to avoid read/write conflicts with the TDL. This repeats until 512 periods or 2.56 ps have passed (unless otherwise stated), and the data is transferred onto a computer. It is noted that there is no dead-time on the WCD when not calibrating, and the device acts as a DI-DSO/TDC hybrid.

When calibrating (e.g., via phase-shifted calibration 250, external signal 255, calibration select 260, and DPS control 265), the signal S is switched by the control logic 220 to a second PLL output whose frequency is a ratio of 200 MHz. S is then shifted in phase relative to C in increments Δt=78 ps by engaging the phase-shifting ports. When the DPS operation finishes after a minimum of two 50 MHz cycles of the external oscillator 242, the memory address is updated (via enable and address 270), the write enable signal is sent by the control logic 220 to the RAM 210, and the TDL captures S on the rising edge of C. The net phase shift on the signal at this time is nΔt, where n is the memory address at which X is stored on the negative edge of C. The process repeats until 512 increments have occurred, corresponding to a phase-shift of 4π, and the difference in carry positions of the edge of the signal at each phase-shift are used to calibrate the device.

The WCD is fundamentally limited by the mean carry time τ. This is the smallest time-interval between which the signal is registered, and is often referred to as the resolution. It has been determined that this value is approximately τ~5 ps for the implementation using the Cyclone V architecture. The resulting design space is then constrained by the length of the carry chain K and the period of the capture clock T.

For the WCD to continuously measure S, the time required for the signal to travel down the chain K×z must be greater than or equal to the time between captures T. Otherwise, portions of the waveform are lost in between clock intervals. Hence, use K×τ≥T. Further constraints on K arise due to device-dependent properties of the FPGA architecture. For the Cyclone V DE10 Nano for example, the maximum CC length is K=1740, which spans the height of the chip. Because the carry enters from the top of the chain, this sets the maximum possible buffer time K×τ. It is noted that there also exist variations in the rise and fall times of the carry elements $\tau_{rise}>\tau_{fall}$. Consequently, a pulse traveling down the chain experiences contraction due to the falling edge (tail) catching up to the rising edge (head) of the pulse. This further limits K according to the tolerable level of pulse-shortening. That is, if the minimum time between pulses to be resolved is $T_{min}$, then $K\times(\tau_{rise}-\tau_{fall})<T_{min}$. In practice, it has been determined that K≤1500 prevents total degradation of sub-nanosecond pulses.

There are further constraints on measuring the signal S. If S is generated external to the FPGA, it must first pass through a pin and an I/O buffer before being routed onto the chip and measured. Within the chip fabric, S also enters the TDL through an initial copy gate at the top of the CC before being carried, as it cannot be fed directly into a carry port. The copy gate and I/O buffer both have high bandwidth but introduce signal distortions such as a difference in rise and fall time. The path the signal takes through the CC is set as a false path in the timing analyzer. This is because the travel time through the CC imposes false timing constraints that cannot be met by the compiler and are to be ignored to avoid critical timing failures.

Figure 3:
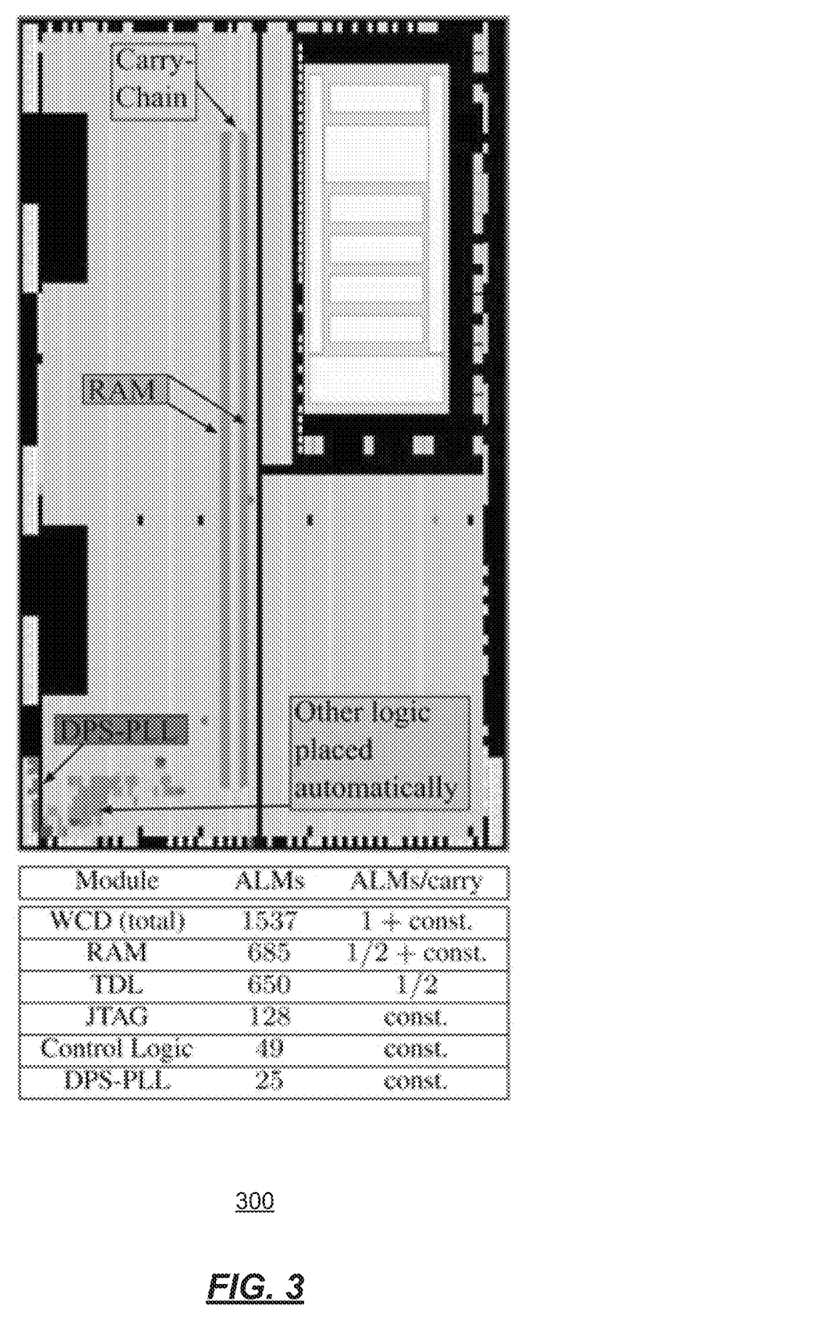
FIG. 3 is a diagram showing an implementation of resource allocation for a WCD.

Timing constraints are primarily the skew—or difference in travel time of the clock signal—to each register, as well as the travel time required for the data to be transferred from the TDL to RAM. These are minimized by routing the on-chip PLL governing waveform capture through a global clock fabric minimizing the skew, as well as placing the RAM and TDL directly adjacent to each-other as shown in FIG. 3. FIG. 3 is a diagram showing an implementation of resource allocation 300 for the K=1300 carry-element WCD on a Cyclone V. These techniques allow for continuously registering the CC without dead-time up to a 200 MHz PLL output, yielding a time between captures of T=5 ns. This strikes a balance between the nominal minimum period T=1.43 ns derived from the maximum frequency of 700 MHz for Cyclone V PLLs, and the approximate maximum buffer time of 7.5 ns due to a K=1500 CC.

DPS calibration is limited by the minimum possible dynamic phase shift Δt=78 ps for a Cyclone V, given by ⅛ the maximum frequency of 1600 MHz for the voltage controlled oscillator (VCO) governing the PLL. This phase-shift is minimized to maximally populate the number of edge positions recorded at each carry during calibration. Dead-time arises due to the process of engaging the auxiliary ports on the PLL enabling DPS. The first two ports need only be set once, and specify the desired PLL output to phase-shift and the direction to phase-shift. In an implementation, these are set to static values so as to shift the calibration signal in the positive direction. However, to begin DPS, the last port is asserted logic high for two clock cycles of the 50 MHz free-running external crystal oscillator onto which the PLL locks. This process unlocks the PLL to the reference oscillator and the re-locking procedure is asynchronous and device-dependent. In practice, it has been determined that it ranges from the minimum of two clock cycles to several dozen depending on the FPGA and operating conditions.

Moreover, the uncertainty on the timing of the waveform is limited by the relative timing errors on the two outputs of the PLL, and by the jitter of the crystal oscillator (e.g., Siliconix) that drives them. The Cyclone V reference manual lists the maximum jitter on the PLL over 15 standard deviations as 300 ps and on the phase shift as 50 ps, though these values are highly conservative. The actual timing error—quantified by the single-shot precision, or the root-mean-square timing error over the full CC—is essentially equal to the nominal 30 ps jitter on the crystal oscillator. As a result, it is determined that this jitter on the crystal oscillator as the largest source of error in the WCD after all other design constraints have been accounted for. Therefore, other implementations of the WCD can obtain a greater precision by using a higher quality crystal oscillator with lower jitter.

Figure 4A:
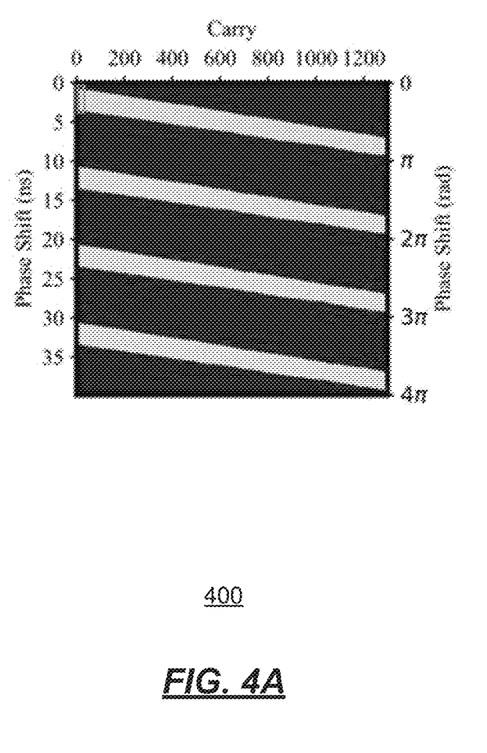
FIGS. 4A, 4B, and 4C show example data captured by an implementation of a WCD, useful for calibration.
Figure 4B:
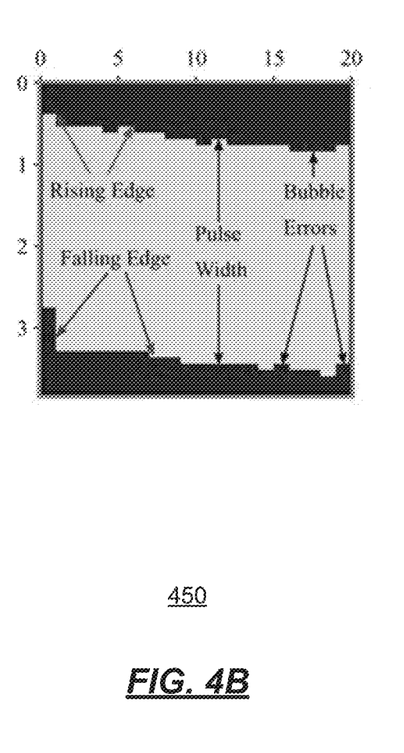
Figure 4C:
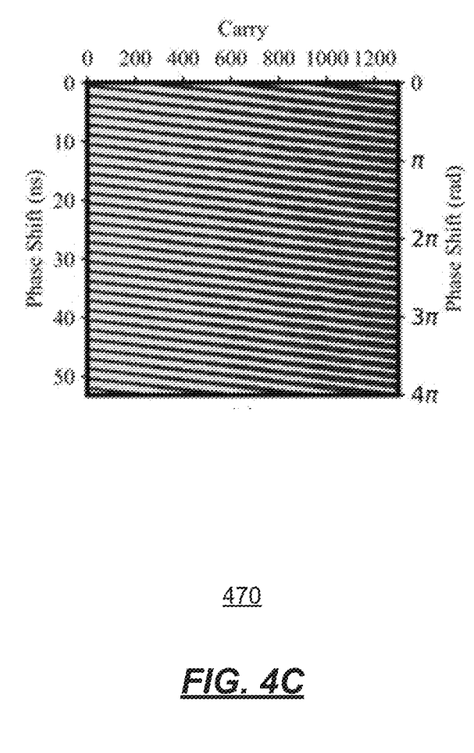

FIGS. 4A, 4B, and 4C show example data captured by an implementation of a WCD, useful for calibration. Regarding calibration, in an implementation, FIGS. 4A and 4C show datasets 400, 470 respectively, obtained from dynamic phase-shifted calibration measurements of two different PLL outputs with different frequencies. Horizontal slices correspond to registered states of the chain X after the phase-shift indicated on the vertical direction. Light pixels are positions in the CC where the register latched 1, and dark pixels 0. Note the unprecedented nature of the data: captured waveforms at $10^{-12}$ s intervals without error correction or post-processing ('raw data'), from which individual features can readily be examined as in FIG. 4B.

Shown in FIG. 4A are 2.5 ns wide pulses generated every 10 ns by a 100 MHz, 25% duty-cycle PLL output. Every integer multiple of 2π, these pulses align with the rising edge of the 200 MHz capture clock. Hence, as the phase is incremented by Δt=78 ps down the vertical, the pulses progress horizontally down the chain. The duty cycle is such that a single pulse exists within the carry chain at any given time. This simplifies the calculation of the speed of the rising and falling edges, for which a unique pair of tuples (phase shift, edge carry index) can be obtained from each horizontal slice. From this data, calculate the speed of the edges and obtain a transfer function t(x), which maps every carry position to a time interval relative to the capture event.

Shown in FIG. 4C are 0.83 ns pulses occurring every 1.67 ns arising from a 600 MHz, 50% duty-cycle PLL output. This frequency and duty cycle ensures that multiple pulses exist within the CC at any given time, which simplifies a calculation of the rate at which pulse widths shrink as a function of the position of their falling edge. This phenomenon, known as pulse shrinking, arises due to difference between the speed of the rising and falling edges, and can be seen by observing the pulse widths decrease within a single horizontal slice of FIG. 4C. For this analysis, use Δt=104 ps due to limitations generating incommensurate PLL outputs at high frequencies.

As can be seen in the diagram 450 of FIG. 4B, the signal expands as it enters the chain. This is analogous to the change in propagation speed of a wave at the boundary between two media: the first element in the CC is a copy gate, which takes much longer to operate than the subsequent carry elements. This means that the largest differential nonlinearity, or deviation from a constant speed, occurs at the start of the chain. Additionally, bubble errors, which are due to jitter in the arrival of the clock signal at the registers (i.e., not all registers latching simultaneously), are clearly visible. These non-idealities (e.g., pulse-shrinking, bubble errors, and differential nonlinearities) induce signal distortions.

However, it has been determined that the signal remains faithfully represented even in the presence of these distortions. By way of explanation, highlight several checks, some of which can be seen from FIGS. 4A-4C. The first such check is to note that the nominal 2.5 ns width of the pulses in FIG. 4A are accurately represented along the vertical, demonstrating the stability of the phase-shift. This is also demonstrated by noting that the nominal 10 ns between pulses are clearly visible. Another check (not shown) is to feed in a signal of constant logic high and ensure that the data are all 1's. This ensures the stability of the registers at the capture frequency.

Figure 5A:
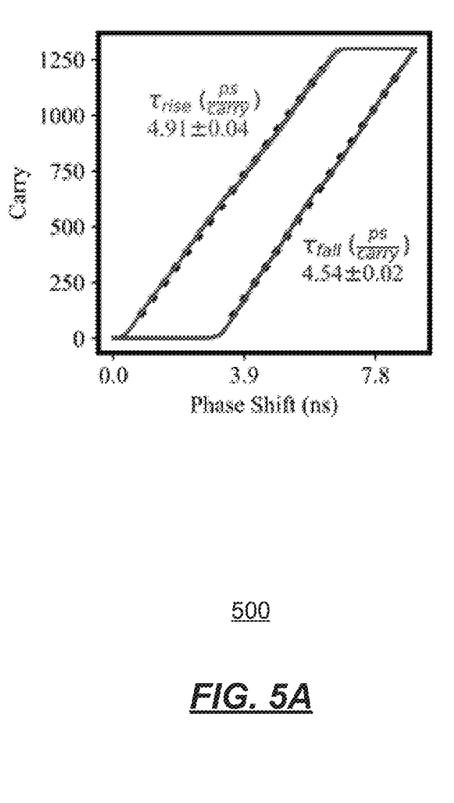
FIGS. 5A, 5B, and 5C are diagrams that show carry speed calibration over 8 TDLs on 3 FPGAs, transfer function for a single FPGA and TDL, and pulse widths and linear contraction rate, respectively.
Figure 5B:
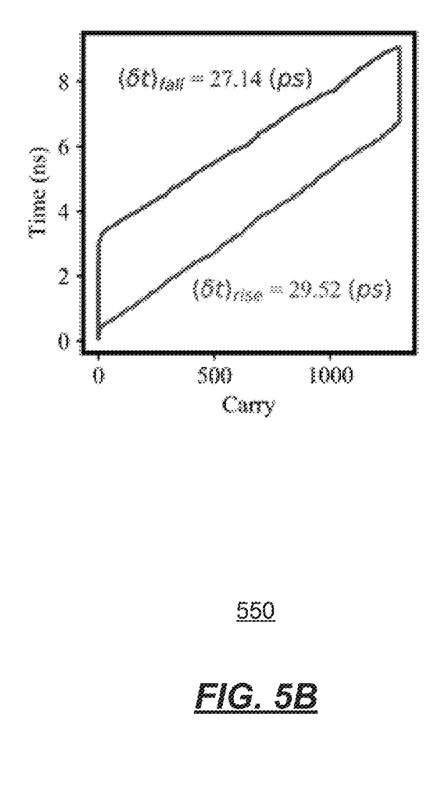
Figure 5C:
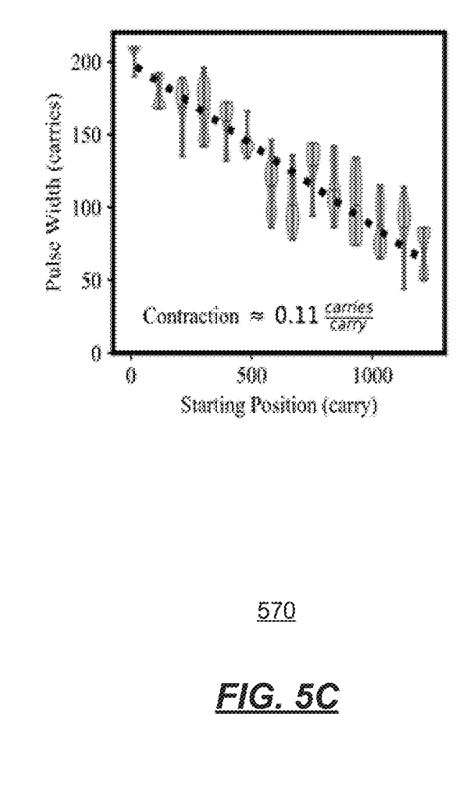

FIGS. 5A, 5B, and 5C are diagrams 500, 550, 570 that show carry speed calibration over 8 TDLs on 3 FPGAs, transfer function for a single FPGA and TDL, and pulse widths and linear contraction rate, respectively.

It has been determined that the rising and falling edges exhibit a highly linear relationship between edge position and phase shift so that carry rise and fall times can be calculated from a linear fit to the data. This is shown by the black dotted lines in FIG. 5A, in which the (phase shift $n\Delta t$, edge carry index $x_i$) tuples are extracted from data of the kind in FIG. 4A for the rising and falling edges. This data is binned over eight TDL locations and three FPGAs, from which a distribution of carry indices at each phase shift may be obtained, having standard deviations $\delta x_i \sim 10$ carries. These data with errors are fit to straight lines, the reciprocal slopes of which yield the quoted carry times for MLABs $\tau_{rise}=4.91\pm0.04$ ps and $\tau_{fall}=4.54\pm0.02$ ps. For LABs (not shown) the values are determined to be 6.35±0.15 ps, 5.60±0.12 ps.

The data in FIG. 5A can be transposed in order to obtain a mapping from carry index x to time interval t(x), realizing full TDC functionality. In the TDC literature, a single TDL would be referred to as a channel and calibrated individually. This is shown in FIG. 5B. The uncertainty in the timing δt at carry index x is given by the local slope of the mapping t(x) multiplied by the uncertainty in the edge carry index at that time, i.e., $\delta t(x)=t(x)=t^0(x)\delta x$, where $t^0$ is the derivative of t(x). The quoted uncertainties <δt>~30 ps are the RMS errors (single-shot precision) for each edge over the full dynamic range (K×τ). They are of the same magnitude as the jitter of the crystal oscillator, suggesting the primary source of error is this jitter.

The differences between rise time and fall time cause pulse shrinking, which are calculated explicitly in FIG. 5C from the data shown in FIG. 4C. Define a pulse width as the length of any observed number of contiguous 1's. This definition means that bubble errors dominate the distribution and interrupt 'real' pulses. This is therefore a simple approximation, and widths below 15 carries are filtered to exclude these bubbles. These widths are binned as a function of the position of their falling edge, and the distributions are shown. The resulting data is then fit to the dotted line, the absolute value of the slope being the quoted contraction.

The fractional difference in rise and fall times is 1−4.91/4.54≈8%, consistent with the 11% fractional rate of contraction obtained from this basic analysis (for LABs it has been determined to be closer to 20%). This means that the rate of pulse-shrinking is essentially linear. As a consequence, this type of signal distortion can be inverted with a simple error correction algorithm, such as dilating the pulses according to the observed rate of contraction. Such an algorithm is described below.

Figure 6:
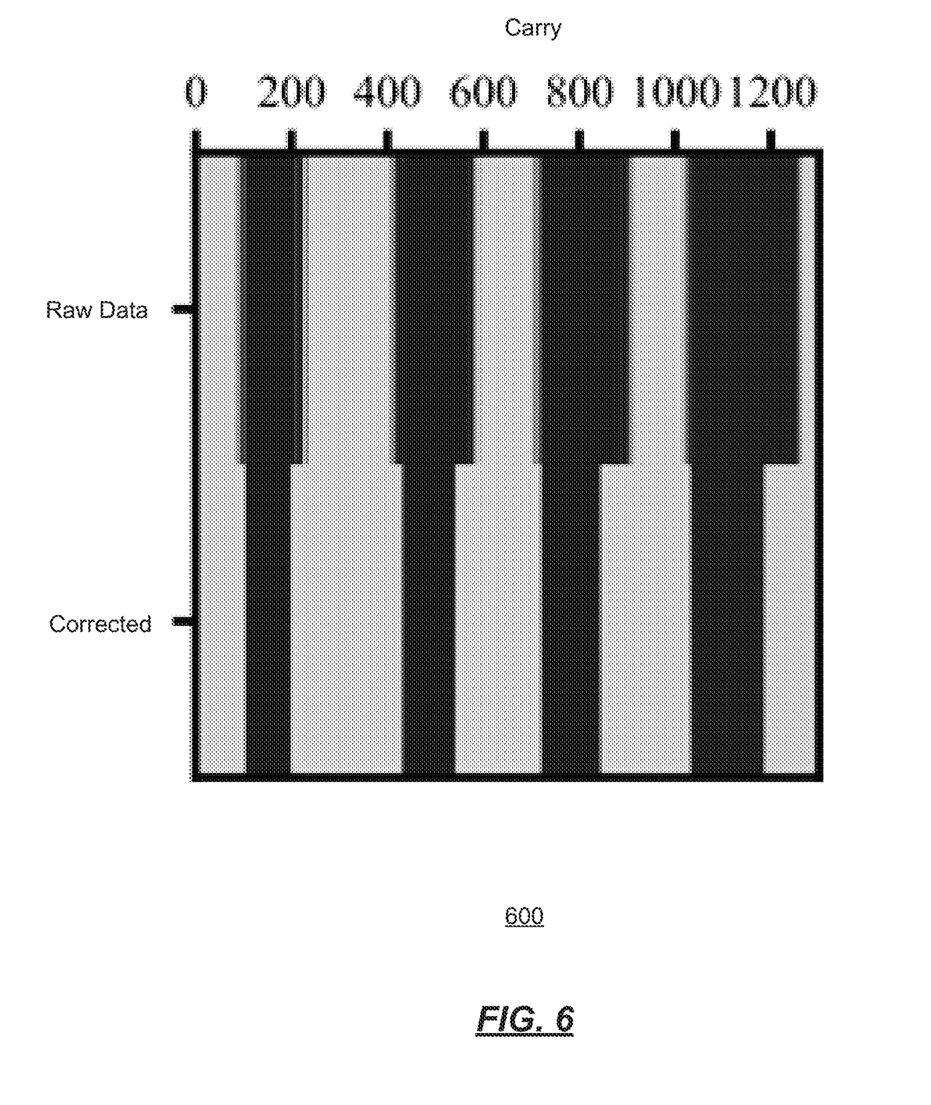
FIG. 6 is a diagram of raw and corrected data from a single state of the CC in FIG. 4C.

FIG. 6 is a diagram 600 of raw and corrected data from a single state of the CC in FIG. 4C. More particularly, FIG. 6 shows the result of applying error correction to a single state of the CC from FIG. 4C. The algorithm fills in all bubble errors and reverses the effects of pulse contraction in software. It is noted that the copy element at the start of the CC acts as a low-pass filter that limits the switching time to ~50 ps; thus, isolate all contiguous regions of zeros of width greater than 15 carries and obtain the indices of these regions. For example, in the raw data shown in FIG. 6, the last such set of zeros is from carry 1033 to 1249. Next, reverse pulse shortening by reducing the right endpoint of each empty region by a multiplicative factor −0.95 in the image above (e.g., 1249→floor[0.95×1249]). Finally, reverse bubble errors by filling in all points which do not lie in these regions with logic high.

It is noted that previous TDC error-correction algorithms rely on thermometer encodings, which are not applicable to arbitrary waveforms. However, the algorithm described herein does not account for the expansion at the start of the chain and the extra contraction in the center. More algorithms or techniques that correct for these nonlinearities, such as functional transforms rather than constant multiplicative factors, may be used.

Thus, the FPGA-based measurement system herein uses CCs that is capable of directly capturing digital waveforms on ps time-intervals, incorporating the core functionality of DI-DSOs and TDCs while using a simpler architecture. The calibration method herein uses dynamic phase-shifting that is applicable to current DI-DSOs and TDCs on FPGAs, replacing the large logic overhead and data requirements of the state-of-the-art with a straightforward velocity calculation.

In summary, carry chains and phase-lock loops are used for the direct capture of digital waveforms and for calibration using dynamic phase-shifting. In doing so, a ps-scale-resolution FPGA-based measurement system is provided with hybrid digital storage oscilloscope and time-to-digital converter functionality. As a result, the WCD finds application in any scenario where high-precision, ultra-fast measurements are required and a low-cost, off-the-shelf solution is desirable.

There are several advantages to WCD design and DPC. First, both are straightforward: fundamentally the WCD is a buffer, and DPC is a velocity calculation that requires only a single memory read-out. These concepts are easily accessible and, when implemented with the proposed architecture, yield raw-data that is both interpretable and precise. As a result, the WCD is natural for FPGA applications, which aim for ease-of-use.

Second, as an FPGA-based measurement system the WCD design is flexible, and it has the advantage that it can measure signals generated internal to the FPGA without the need for additional hardware. Additionally, due to its modular nature and similarity to DSOs and TDCs, integrated systems can easily incorporate the WCD in place of or in combination with these designs, and leverage existing error correction architectures such as bubble error correctors.

The flexibility of the design immediately presents several extensions of the WCD. For example, the sampling rate and resource count can be improved by using two registers per carry. DPS can be used to delay the measurement clock and incrementally capture repeated signals in Δt intervals. Data transfer off the board can be streamlined using the hardprocessor rather than the JTAG interface.

It is noted that analog waveform capture is also possible. Each TDL acts as a 1-bit ADC or comparator as described by θ in Eq. 1. Similar to a flash-ADC, the domain of the input waveform [$V_{min}$, $V_{max}$] can be partitioned into a series of subsets ranging over the amplitude of the signal [$V_{min}$, $V_1$), [$V_1$, $V_2$), . . . ,[$V_M$,$V_{max}$] using external comparators having thresholds corresponding to each sub-interval. The output of each comparator can then be passed into a corresponding TDL. Each of the TDLs would thus trace the associated portion of the analog signal within that subdomain. The continuous approximation of the amplitude of the waveform could then be recovered from each of the TDLs, yielding an analog WCD. Extending the WCD in this manner (for instance, using Field-Programmable Analog Arrays or FPAAs) is the subject of future work.

As used herein, the singular form "a," "an," and "the" include plural references unless the context clearly dictates otherwise. As used herein, the terms "can," "may," "optionally," "can optionally," and "may optionally" are used interchangeably and are meant to include cases in which the condition occurs as well as cases in which the condition does not occur.

Ranges can be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint. It is also understood that there are a number of values disclosed herein, and that each value is also herein disclosed as "about" that particular value in addition to the value itself. For example, if the value "10" is disclosed, then "about 10" is also disclosed Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed:

1. A device comprising:
   a time-to-digital converter (TDC); and
   a digital oscilloscope (DO),
   wherein the device is a waveform-capture-device (WCD), and
   wherein the WCD uses a plurality of carry-chains (CCs) to capture a digital waveform without encoding the digital waveform.

2. The device of claim 1, further comprising a tapped delay line (TDL) comprising a plurality of registers and the plurality of CCs.

3. The device of claim 1, wherein the WCD is a 5 ps-resolution TDC/ultra-fast DO hybrid.

4. The device of claim 1, wherein the WCD is implemented on a field-programmable gate-array (FPGA).

5. The device of claim 1, wherein the WCD is configured to measure complex GHz frequency waveforms at picosecond time intervals.

6. The device of claim 1, wherein the WCD is calibrated via a dynamic phase-shifting (DPS) process that adjusts a phase of a stable on-board clock.

7. The device of claim 2, wherein each CC is used to buffer an input signal and wherein the registers are used to capture a waveform of the input signal on an edge of a clock.

8. The device of claim 7, wherein each CC comprises at least one carry-element (CE) that passes the input signal to another CE after a time-delay.

9. A method of calibrating a waveform-capture-device (WCD), the method comprising using dynamic phase shifting (DPS) for discrete measurement,
   wherein the DPS uses dynamic-phase calibration (DPC), and
   wherein the DPS generates ps-scale time-intervals without reconfiguring a field-programmable gate-array (FPGA).

10. The method of claim 9, wherein the DPS functions by adjusting the phase of a stable on-board clock, wherein the clock is a phase-lock loop (PLL).

11. The method of claim 9, wherein the WCD is a digital buffer and the DPC is a velocity calculation that measures the distance travelled down the digital buffer after a phase-shift.

12. The method of claim 9, wherein for the discrete measurement, a capture time is incrementally delayed in discrete intervals via the DPS, and an input signal is repeatedly generated and measured once after every accumulated phase shift, thereby allowing for calibration of a carry speed.

13. A waveform-capture-device (WCD) comprising:
   a time-to-digital converter (TDC);
   a digital oscilloscope (DO); and
   a tapped delay line (TDL) comprising a plurality of registers and a plurality of carry-chains (CCs),
   wherein the CCs are configured to capture a digital waveform without encoding the digital waveform,
   wherein each CC is used to buffer an input signal and wherein the registers are used to capture a waveform of the input signal on an edge of a clock, and
   wherein each CC comprises at least one carry-element (CD) that passes the input signal to another CE after a time-delay.

14. The device of claim 13, wherein the WCD is implemented on a field-programmable gate-array (FPGA), wherein the WCD is configured to measure complex GHz frequency waveforms at picosecond time intervals, and wherein the WCD is calibrated via a dynamic phase-shifting (DPS) process that adjusts a phase of a stable on-board clock.

15. The device of claim 14, wherein the DPS uses dynamic-phase calibration (DPC) and wherein the DPS functions by adjusting the phase of a stable on-board clock, wherein the clock is a phase-lock loop (PLL).

* * * * *